United States Patent [19]

Miodownik

[11] Patent Number: 4,646,258

[45] Date of Patent: Feb. 24, 1987

[54] SAMPLED N-PATH FILTER

[75] Inventor: Saul Miodownik, Bronx, N.Y.

[73] Assignee: Memorial Hospital for Cancer and Allied Diseases, New York, N.Y.

[21] Appl. No.: 785,095

[22] Filed: Oct. 4, 1985

Related U.S. Application Data

[63] Continuation of Ser. No. 454,774, Dec. 30, 1982, abandoned.

[51] Int. Cl.[4] .............................................. H03H 19/00
[52] U.S. Cl. .................................... 364/825; 328/151; 333/167
[58] Field of Search ............... 364/413, 415, 417, 724, 364/825; 333/167; 128/696, 901, 902, 700, 710; 455/307, 298; 340/825.71; 328/151

[56] References Cited

U.S. PATENT DOCUMENTS

| | | | |
|---|---|---|---|
| 4,007,360 | 2/1977 | Kniel et al. | 235/152 |
| 4,050,026 | 9/1977 | Cerra et al. | 328/134 |
| 4,059,818 | 11/1977 | Kostelnicek | 340/15.5 DP |
| 4,161,945 | 7/1979 | Grossman | 128/696 |
| 4,184,487 | 1/1980 | Peyer | 128/710 |
| 4,231,018 | 10/1980 | Imagawa et al. | 340/171 R |
| 4,244,030 | 1/1981 | Albarello | 364/825 |
| 4,319,207 | 3/1982 | Gignoux | 328/151 |
| 4,378,538 | 3/1983 | Gignoux | 333/173 |
| 4,408,615 | 10/1983 | Grossman | 128/696 |

OTHER PUBLICATIONS

*Biomedical Instrumentation*, Geddes et al 1968.
*Suppression of Parasitic Oscillation*... Butterweck 1975, 3641724, AEU Band 29, 1975, Heft 9.
*A Digitally Controlled Tunable N-Poth Filter* Patangia et al. IEEE Trans. Cir. & Syst. vol 25, 3/78.
*Low Power Electrocardiographic Data Acquisition*... Fostik et al. Med. & Biol. Eng. & Comp. 1980.

*Primary Examiner*—Jerry Smith
*Assistant Examiner*—Clark A. Jablon
*Attorney, Agent, or Firm*—Felfe & Lynch

[57] ABSTRACT

An N-path filter has a number N of parallel resistive-capacitive filter sections. A switching arrangement connects each filter section periodically into an input signal path through the filter. The switching arrangement also triggers a sample and hold network to sample the filtered input signal for a portion of the time each filter section is connected into the input signal path through the filter and then hold the sampled, filtered input signal. The sampling time is preferably selected to be an initial portion of the time each filter section is connected as the signal path through the filter when variations in the charging rates of the capacitors in the filter sections have the least effect. The sampled N-path filter technique thus reduces the need to match the filter section components. With the addition of a further low-pass filter to suppress harmonics, the sampled N-path filter is particularly suited for use in frequency-responsive medical diagnostic equipment such as electrocardiographs and electroencephalographs.

13 Claims, 3 Drawing Figures

SAMPLED N-PATH FILTER

This is a continuation of application Ser. No. 454,774, filed Dec. 30, 1982 and abandoned herewith.

BACKGROUND OF THE INVENTION

The invention relates to active electronic filters and their use in medical diagnostic equipment.

Active electronic filters are in wide use today because solid state devices have made the required, active, switching functions practical and because high selectivity filters can be designed from actively switched networks of resistors and capacitors without cumbersome inductors. One type of active electronic filter is an N-path filter.

N-path filters have a number N of parallel resistive-capacitive filter sections and a switching arrangement to connect each filter section periodically into an input signal path through the filter. Each filter section has an identical transfer function. This has required matching the charging characteristics of the capacitors in the filter sections. Matching the charging characteristics of a set of capacitors for each filter is a tedious, time-consuming, costly, individual assembly operation for each filter. Additionally, mismatches in the capacitors reduce the depth of the rejection notch at the filter frequency. A way to reduce the effect of variations in the charging characteristics of the capacitors sufficiently to allow off-the-shelf capacitors to be used in an N-path filter without substantial matching would thus make N-path filters much easier to make, particularly if the technique used other off-the-shelf components which did not require matching or other arduous assembly techniques.

Except for their difficult matching problem, the precision of N-path filters would be particularly useful to achieve the medical-quality precision required in electronic medical diagnostic equipment. The body functions to be diagnosed with such equipment are analog. Transducing the analog body function into an analog signal for processing into an analog output is therefore a desirably direct approach, but precision filters are required to process the analog signal precisely. Electrocardiographs and electroencephalographs operated from line-frequency power exemplify the need for precision filters in such analog medical diagnostic equipment.

The frequencies of the functions to be diagnosed with such devices include the usual power line frequencies, 50–60 Hz. A filter to eliminate the narrowest possible notch of frequencies about the line frequency to eliminate power line frequency interference from the diagnostic signal while retaining as much as possible of the rest of the diagnostic signal bandwidth is therefore desired. N-path filters can filter out narrow notches, i.e. have a high Q factor, and therefore would be desirable in such diagnostic devices except for the difficult matching problem in making them.

SUMMARY OF THE INVENTION

It is therefore an object of the invention to provide an N-path filter with a way of reducing the effect of variations in the components of the N-path filter and, more particularly, to reduce the effect sufficiently to allow the use of off-the-shelf components without matching.

It is another object of the invention to provide a precision, multi-function filter for medical diagnostic equipment such as electrocardiographs and electroencephalographs.

To these ends, the invention has an N-path filter and a sample and hold network arranged to reduce the effect of variations in the components of the N-path filter. Conceptually, the invention recognizes that variations in the components of the filter affect the rate at which the capacitive filter components charge. The effect of the component variations is therefore cumulative over the charging interval, and least over the initial portion of the interval. The sample and hold network therefore responds to a sampling signal within the period of each switching signal for the N-path filter to sample only a portion of the interval of operation of each filter section of the N-path filter, and preferably the initial portion of operation.

The sample and hold network and the switching network to make it sample and hold the signals on the periodically connected filter sections of the N-path filter can be assembled from off-the-shelf components. The combined circuitry, here called a sampled N-path filter, thus reduces the requirements for matching the components of the N-path filter without imposing significant additional assembly difficulties.

The periodic connection of the filter sections of the N-path filter into the input signal path through the filter is a sampling technique in which each filter section samples a portion of the input signal. Although proper sampling rates produce precision filtered representations of the input signal, sampling is a technique which inherently produces only an approximation of an analog signal. Using a further sample and hold technique to improve a sampling filter is thus an unexpected turn from routine thoughts on precision signal processing.

DESCRIPTION OF THE DRAWING

A preferred emobodiment which is intended to illustrate but not to limit the invention will now be described with reference to the drawings in which.

DESCRIPTION OF THE PREFERRED EMBODIMENT

A signal to be filtered is applied to an input port 10 of an N-path filter at 12. Clock pulses are generated in clock signal devices at 14. The clock pulses are counted in a recycling counter 16 and coded by the arrangement of its outputs. One portion of the coded count of clock pulses from the counter 16 is decoded in NAND gate 18 to trigger a sample and hold network at 20 to sample and hold the input signal as filtered by the filter section of the N-path filter then connected as an input signal path through the filter. Another portion of the coded count of clock pulses switches the filter sections of the N-path filter into the input signal path through the filter. These components therefore form a sampled N-path filter.

Figure 1:
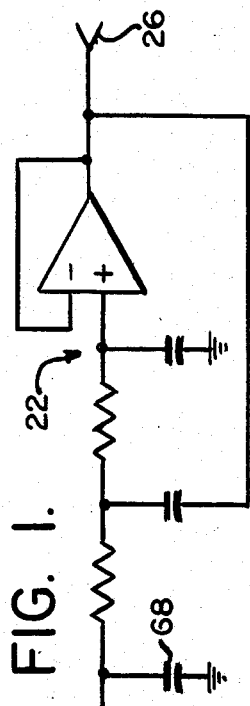
FIG. 1 is a schematic of the preferred embodiment.
Figure 2:
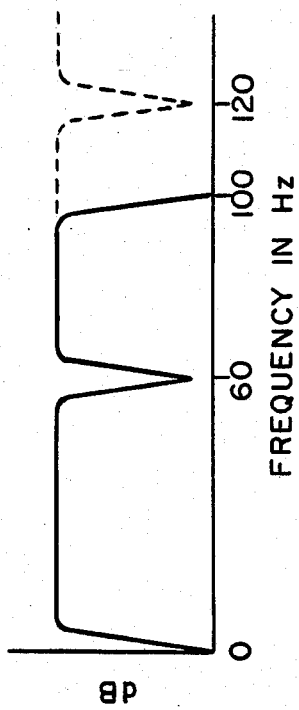
FIG. 2 shows the transfer function of the embodiment shown in FIG. 1.

The preferred embodiment is intended for an electrocardiograph or electroencephalograph which operates from line frequency power. It therefore includes a line frequency power input 21 for the clock 14 to synchronize the switching portion of the coded clock pulses and thus the sampled N-path filter to the line power frequency. This holds the fundamental or notch frequency of the filter at line frequency. The sampled N-path filter is designed to provide a high Q (narrow) and high-rejection (deep) notch in the filter transfer function about the fundamental frequency. Since the fundamental frequency is held at line frequency, this eliminates power line frequency interference while retaining as much as possible of the remaining diagnostic signal. Finally, an active low-pass filter at 22 suppresses harmonics of the N-path filter fundamental frequency. The output signal at port 26 thus is synchronously notched at the power line frequency in the N-path filter and limited to a diagnostic band about the fundamental frequency of the N-path filter by low-pass filter 22, as shown in FIG. 2. Such a signal is useful for electrocardiographs and electroencephalographs.

In greater detail, the input signal at port 10 passes through a buffer 28 to one side of a parallel arrangement of eight capacitors C-1 to C-8 of the N-path filter at 12. The other sides of the capacitors C-1 to C-8 are connected to a multiplexer 30 which may be of the type designated 4051. The N-path filter is thus seen to be a shunt switched design, but other embodiments may use the double switch N-path filter design which has switches on both sides of the parallel arranged filter sections here represented by the capacitors C-1 to C-8. The multiplexer 30 periodically and sequentially connects each of the capacitors C-1 to C-8 into an input signal path through the N-path filter to line 31. Resistors 32 and 34 are connected between line 31 and ground to complete a resistive-capacitive filter section of the N-path filter with each successive one of the capacitors C-1 to C-8 connected to line 31 by the multiplexer 30. Resistor 32 is made variable to adjust the Q-factor of the filter.

Coded clock pulses on lines 36, 38 and 40 from the coder-counter 16 to the multiplexer 30 sequence of the multiplexer. The clock pulses are synchronized to line frequency power provided to port 21. Other ways of generating the clock pulses could be used. Line frequency was selected here because of the way N-path filters operate and the intended use of the preferred embodiment with an electrocardiograph or electroencephalograph operated from line power. The pass band of the N-path filter is symmetrical about the frequency with which the filter sections C-1 to C-8 are switched into the input signal path through the filter (and its harmonics). A pass band synchronously centered about line frequency is therefore desirable for suppressing line frequency interference in the line powered electrocardiogph or electroencephalograph.

The line frequency power at port 21 is passed through a buffer 44 to a phase locked loop network at 46 which is assembled in the known way about an integrated circuit 48 of the CMOS type designated 4046. The phase locked loop provides suitable logic-level clock pulses over line 50 to the codercounter 16.

The counter 16 and decoder 18 are arranged to code the clock pulses by dividing their number by eight. Maintaining the necessary coordination between the switching frequency of the multiplexer 30 and the pass band for the intended input signal therefore requires clock pulses at eight times line frequency. The phase locked loop 46 therefore multiplies the line frequency by eight with feedback control from each cycle of the counter 16 or every 128th pulse over line 40.

The counter 16 is a CMOS integrated circuit of the type designated 4024. It is arranged to continually cycle through a full count of six binary digits which are respectively provided to output lines 52, 54 and 56, and the previously described lines 36, 38 and 40 to the multiplexer. Line 52 carries the lowest order, one's, count of the clock pulses and the higher orders of the binary count of successive clock pulses then progress leftward to the adjacent lines 54, 56, 36, 38, and 40. Eight clock pulses (binary 1000) are therefore required to produce a logic one signal on line 36. A further eight pulses for a count of 16 (binary 10,000) switches the signal on line 38 to a logic one and line 36 to a logic zero to switch the multiplexer 30 and thus the input signal path through the N-path filter to the next of capicitors C1 to C8.

An eight pulse code from counter 16 also triggers the sample and hold network at 20. For this, the first eight clock pulses, and each additional set of eight, establish all logic zero signals on lines 52 to 56 from counter 16 to decoder NAND gate 18. In the interval from every eighth clock pulse to the next, line 50 from the phase locked loop also provides a logic zero to gate 18. Gate 18 thus changes state to provide a sampling signal over this interval which is the first one-eighth of each of the coded switching signals on lines 36 to 40 to the multiplexer.

The gate logic signal over the initial one-eighth interval of each switching sequence of the multiplexer is provided over line 58 to the multiplexer to enable the input signal path through the multiplexer to line 31, and to the sample and hold network at 20. In the sample and hold network at 20, the logic signal on line 58 opens a grounding switch 60 and, through gate 62, closes a switch 64 which connects the N-path filter through a buffer 66 to a holding capacitor 68. When the next clock pulse after each group of eight reaches gate 18 over line 50, gate 18 changes state to open the input signal path through the multiplexer 30, close grounding switch 60, and open switch 64. This ends the initial charging interval over which the charge on the capacitors C1 to C8 is sampled, grounds out any output parasitic charges, and stores on capacitor 68 only the first eighth of the signal of each switching cycle of multiplexer 30. By keeping the sampling time short and by grounding parasitic capacitances through switch 60, smaller, less-accurate capacitors C1 to C8 may be used to achieve the desired higher Q and increased notch depth.

Figure 3:
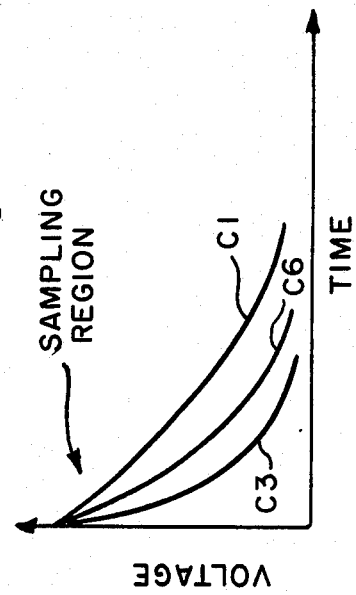
FIG. 3 shows the charging changing characteristics of a portion of the embodiment shown in FIG. 1.

The sampled N-path filter just described thus uses the initial one-eighth of the charging cycle of each of the capacitors C-1 to C-8 in the N-path filter for the signal held on capacitor 68. Since it is the charging rate of the capacitors C-1 to C-8 which varies from one to another, the affect of the variations is cummulative and least in the initial portion of their charging cycle. Using the initial one-eighth therefore selects the most accurate portion of the signal for the sampling region as shown in FIG. 3. Intervals other than the first one-eighth of each switching cycle and other than the initial portion of each switching cycle may of course be selected for other embodiments within the concept of the sampled N-path filter invention here described.

One side of holding capacitor 68 is connected to the active low pass filter at 22 which suppresses harmonics of the N-path filter fundamental frequency. For the intended electrocardiograph or electroencephalograph use of the preferred embodiment, as before described, the fundamental frequency of the N-path filter was selected to be the power line frequency, for example 60 Hz as shown in FIG. 2. The low pass filter therefore can be designed to have a cutoff frequency somewhat below the first harmonic of the N-path filter fundamental frequency at 120 Hz. A low pass filter cutoff frequency of about 100 Hz is satisfactory.

Variations of the preferred embodiment or of its preferred use for signals in an electrocardiograph or electroencephalograph as may occur to those skilled in the art are intended as within the scope of the invention defined by the following claims.

What is claimed is:

1. A sampled N-path filter, comprising:
   (a) an N-path filter having N filter sections and means for connecting each filter section periodically into an input signal path through the N-path filter; and
   (b) sampling means connected to the input signal path through the N-path filter during only a portion of each period each filter section of the N-path filter is connected into the input signal path through the N-path filter for sampling any signal then on the input signal path through the N-path filter.

2. A sampled N-path filter as in claim 1, wherein the sampling means samples the signal over an initial portion of each period each filter section of the N-path filter is connected into the input signal path through the N-path filter.

3. A sampled N-path filter, comprising:
   (a) means for generating clock pulses;
   (b) coder means responsive to the clock pulses for generating periodic switching signals and a sampling signal within the period of each of the switching signals;
   (c) an N-path filter having an input port for receiving an input signal to be filtered, a number N of filter sections, and switching means responsive to the switching signals for successively connecting each of the filter sections one at a time into an input signal path from the input port through the filter; and
   (d) a sample and hold network responsive to each sampling signal for sampling and holding any filtered input signal from the signal path then connected through the filter.

4. A sampled N-path filter as in claim 3, wherein each of the N filter sections comprises a capacitor, and wherein the coding means comprises means for generating the sampling signal within an initial interval of each switching signal.

5. A sampled N-path filter as in claim 4, wherein the N-path filter has a fundamental frequency, and further comprising:
   a low-pass filter receiving the filtered input signal held in the sample and hold network and having a cut off frequency below the first harmonic of the N-path filter fundamental frequency.

6. A sampled N-path filter as in claim 3, wherein the sample and hold network additionally comprises a normally closed switch connected between the input signal path in the N-path filter and ground for grounding any signal from a filter section previously connected to the path which is retained and means opening the switch in response to the sampling signals for causing the sample and hold network to sample and hold any filtered input signal.

7. A sampled N-path filter as in claim 6, wherein the sample and hold network additionally comprises means responsive to each sampling signal for enabling the network to sample and hold any filtered input signal.

8. A sampled N-path filter as in claim 3, wherein the sample and hold network additionally comprises means responsive to each sampling signal for enabling the network to sample and hold any filtered input signal.

9. A sampled N-path filter, comprising:
   (a) means for generating clock pulses;
   (b) a coder having a recycling binary counter producing at discrete ports of the counter binary signals corresponding to the number of clock pulses;
   (c) a decoder gate means connected to the counter ports corresponding only to some, lower order binary count signals for producing a sampling signal for an interval after each full zero count of the lower order binary count signals;
   (d) an N-path filter having an input port for receiving an input signal to be filtered, N-filter sections, and switching means responsive to sufficient higher order binary signals at corresponding ports of the counter to switch successively each filter section into an input signal path through the filter; and
   (e) a sample and hold network having means for holding the successive filtered input signals from each path connected through the N-path filter and switch means responsive to the sampling signal for connecting the signal holding means to the N-path filter signal paths.

10. A sampled N-path filter, comprising:
    (a) an input port for receiving a signal to be filtered;
    (b) a number N of capacitors connected at one side thereof in parallel to the input port;
    (c) a resistor grounded on one side thereof;
    (d) a multiplexer connected to the other sides of the capacitors and the resistor for successively connecting each capacitor to the resistor;
    (e) means for generating clock pulses;
    (f) a recycling binary counter receiving the clock pulses and having discrete output lines for indicating on a first set of the output lines lower order counts of the clock pulses and on a second set, higher order counts of the clock pulses, the second set of output lines being connected to the multiplexer for triggering its successive connection of the capacitors to the resistor;
    (g) a gate connected to the first set of output lines and responsive to each full zero count thereon for generating a sampling signal; and
    (h) a sample and hold network means responsive to each sampling signal for signal-holding connection to the other side of the resistor.

11. A sampled N-path filter is as in claim 10, wherein the sample and hold network additionally comprises a normally closed switch connected between the input signal path in the N-path filter and ground for grounding any signal from a filter section previously connected to the path which is retained and means opening the switch in response to the sampling signals for allowing the sample and hold network means to sample and hold any filtered input signal.

12. A sampled N-path filter as in claim 11, wherein the sample and hold network additionally comprises means responsive to each sampling signal for enabling the network to sample and hold any filtered input signal.

13. In an electronic medical diagnostic device having means for receiving an input signal to be processed for diagnostic use, means for receiving line frequency power, and means using the power and including a filter for processing the input signal, an improved filter comprising:

(a) means for generating clock pulses synchronized to the line frequency power;
(b) coder means responsive to the clock pulses for synchronously generating periodic switching signals and a sampling signal within an initial period of each switching signal;
(c) an N-path filter having an input port for receiving the input signal, a number N of filter sections each having a fundamental frequency at the line frequency, and switching means responsive to the switching signals for successively connecting each of the filter sections one at a time into an input signal path from the input port through the filter;
(d) a sample and hold network responsive to each sampling signal for sampling and holding the initial portion of the filtered input signal from the signal path then connected through the filter; and
(e) a low-pass filter connected to the sample and hold network for suppressing harmonics of the N-path filter fundamental frequency.

* * * * *